United States Patent

Lampe

[11] Patent Number: 5,965,961
[45] Date of Patent: Oct. 12, 1999

[54] ELECTRICAL CIRCUIT ARRANGEMENT

[75] Inventor: Wolfgang Lampe, Neuenrade, Germany

[73] Assignee: Leopold Kostal GmbH & Co. KG, Ludenscheid, Germany

[21] Appl. No.: 09/116,288

[22] Filed: Jul. 16, 1998

[30] Foreign Application Priority Data

Jul. 26, 1997 [DE] Germany .............. 197 32 283

[51] Int. Cl.$^6$ .................................. H01H 47/00
[52] U.S. Cl. .................. 307/125; 307/131; 307/113
[58] Field of Search .................. 307/112, 113, 307/115, 116, 125, 130, 131, 139, 140, 147

[56] References Cited

U.S. PATENT DOCUMENTS 5,739,593  4/1998  Hayama ........................... 307/43
5,883,446  3/1999  Yuth ............................... 307/130

FOREIGN PATENT DOCUMENTS 2151230  10/1970  Germany .
3312153 A1  4/1984  Germany .
4328663 C1  9/1994  Germany .

*Primary Examiner*—Jeffrey Gaffin
*Assistant Examiner*—Jonathan S. Kaplan
*Attorney, Agent, or Firm*—Brooks & Kushman P.C.

[57] ABSTRACT

An electrical circuit arrangement for detecting the switching conditions of individual switching devices includes a direct voltage source having a positive terminal and a negative terminal. Switching groups each having switching devices are connected in parallel between a respective input (e1, e2) and a respective output (a1, a2). Resistors are connected in series to a respective switching device between the respective inputs (e1, e2) and the respective outputs (a1, a2). Each one of the resistors has a preselected resistance value for providing a voltage encoded signal output across the respective inputs (e1, e2) and the respective outputs (a1, a2) when the corresponding switching device is switched on. Evaluation electronics alternately connect at predetermined time intervals the inputs (e1, e2) and outputs (a1, a2) of each of the first and second switching groups to the positive terminal and negative terminal of the direct voltage power supply to measure the voltage encoded signal for determining which switching devices are switched on.

11 Claims, 1 Drawing Sheet

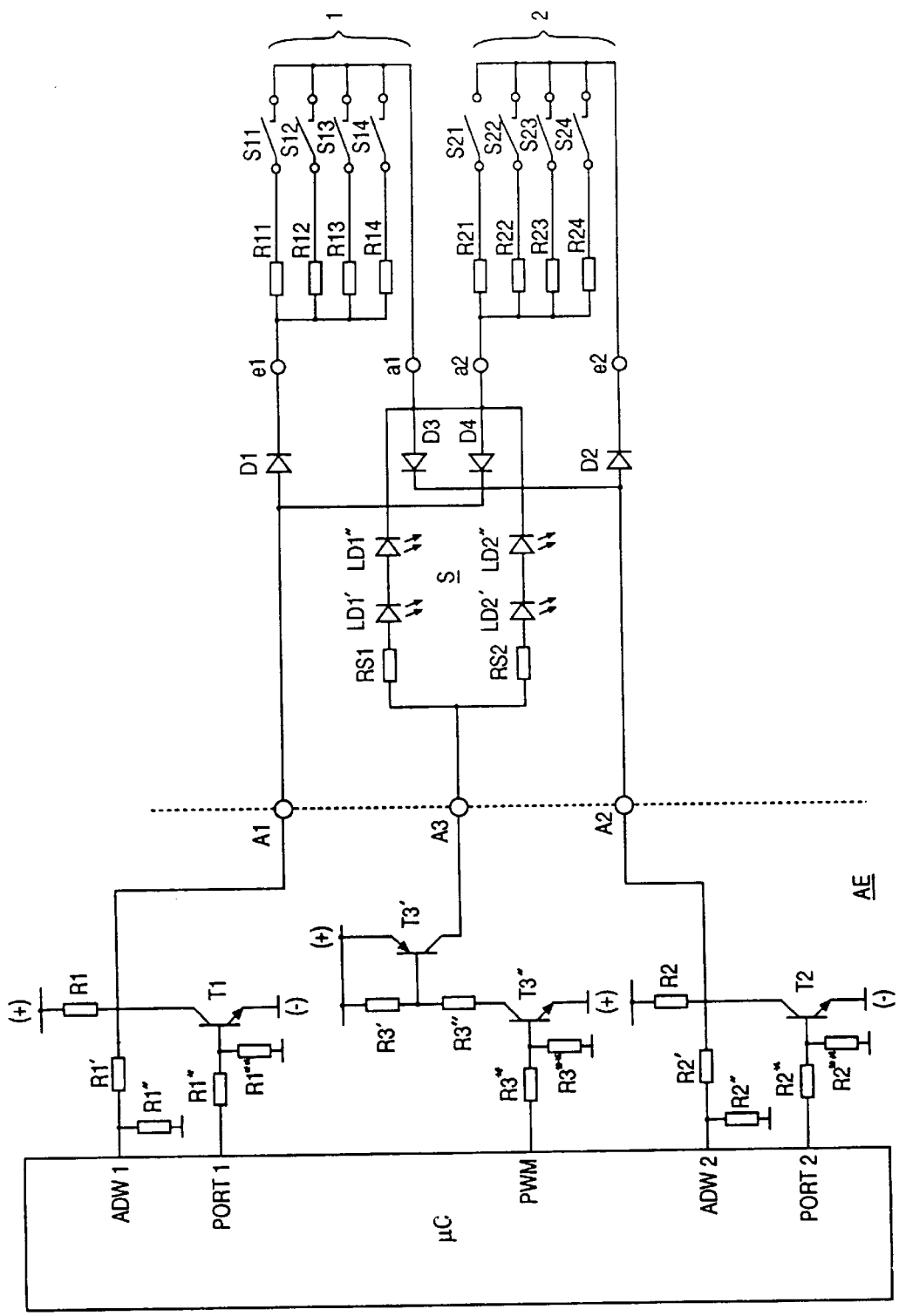

ELECTRICAL CIRCUIT ARRANGEMENT

TECHNICAL FIELD

The present invention relates generally to an electrical circuit arrangement having switching devices and evaluation electronics for monitoring the condition of the switching devices.

BACKGROUND ART

A circuit arrangement of this type—connected to a direct voltage supply—is provided in order, by means of switching devices appertaining thereto to switch electrical consumers cooperating therewith on and off in a power-free manner. Only one signal current is directed via the switching devices by means of which power drivers, for example, relays or power semi-conductors, allocated to the electrical consumers can be actuated. In order, in the case of a plurality of switching devices allocated to a circuit arrangement, to avoid connecting each switching device to its power driver by means of its own electric line it is known to provide them with a respective resistor. The resistors differ in their resistance value so that control signals are imparted to evaluation electronics allocated to the power drivers of the electrical consumers and these control signals move to a different level in the manner of a voltage encoding.

A problem in this principle of operation which is in itself very reliable is that in the case of a multiplicity of switching devices the voltage level appertaining to the switching devices or the currents resulting therefrom no longer differ from each other in their gradation in such a way that, in particular, in the case of a plurality of switching devices operating simultaneously, a reliable detection and allocation of these switching devices or of an individual switching device is ensured by the evaluation electronics.

SUMMARY OF THE INVENTION

Accordingly, it is an object of the present invention to provide an electrical circuit arrangement which detects the state of a relatively large number of individual switching devices.

In carrying out the above object and other objects, the present invention provides an electrical circuit arrangement for detecting the switching conditions of individual switching devices. The electrical circuit arrangement includes a direct voltage source having a positive terminal and a negative terminal. First and second switching groups each having a plurality of switching devices are connected in parallel between a respective input (e1, e2) and a respective output (a1, a2). Each one of the switching devices is switchable on and off. A plurality of resistors are each connected in series to a respective switching device between the respective inputs (e1, e2) and the respective outputs (a1, a2). Each one of the resistors has a selected resistance value for providing a voltage encoded signal output across the respective inputs (e1, e2) and the respective outputs (a1, a2) when the corresponding switching devices are switched on.

The electrical circuit arrangement further includes a first pair of diodes (D1, D2), a second pair of diodes (D3, D4), and evaluation electronics having first and second connections (A1, A2). The inputs (e1, e2) of each one of the first and second switching groups is connected by a respective one of the first pair of diodes (D1, D2) to a respective one of the first and second connections (A1, A2) of the evaluation electronics. The first pair of diodes (D1, D2) are forward biased from the first and second connections (A1, A2) of the evaluation electronics to the inputs (e1, e2) of the first and second switching groups. The outputs (a1, a2) of each one of the first and second switching groups is connected by a respective one of the second pair of diodes (D3, D4) to a respective other one of the first and second connections (A1, A2) of the evaluation electronics. The second pair of diodes (D3, D4) are reversed biased from the first and second connections (A1, A2) of the evaluation electronics to the outputs (a1, a2) of the first and second switching groups.

The evaluation electronics alternately connect at predetermined time intervals the inputs (e1, e2) and outputs (a1, a2) of each of the first and second switching groups to the positive terminal and negative terminal of the direct voltage source to measure the voltage encoded signal for determining which switching devices are switched on.

The advantages accruing to the present invention are numerous. For instance, the number of switching devices can be doubled for the same level of discrimination without increasing the number of electrical connection lines.

These and other features, aspects, and embodiments of the present invention will become better understood with regard to the following description, appended claims, and accompanying drawings.

BRIEF DESCRIPTION OF THE DRAWINGS

The FIGURE is a schematic illustration of the present invention.

BEST MODE FOR CARRYING OUT THE INVENTION

Referring now to the FIGURE, an electrical circuit arrangement in accordance with the present invention is shown. The electrical circuit arrangement includes evaluation electronics (AE) connected to a direct voltage supply having positive and negative terminals. The evaluation electronics (AE) includes first and second connections (A1, A2) connected to first and second switching groups (1, 2). Each one of the switching groups (1, 2) has a plurality of switching devices (S11–S14, S21–S24) connected in parallel between a respective input (e1, e2) and a respective output (a1, a2). Each one of the switching devices (S11–S14, S21–S24) is switchable between on and off states.

A respective one of a plurality of resistors (R11–R14, R21–R24) is connected in series to a respective switching device between a respective input (e1, e2) and a respective output (a1, a2). Each resistor (R11–R14, R21–R24) has a resistance value selected to differ from the resistance value of the other resistors such that when a plurality of switching devices (S11–S14, S21–S24) are switched on electric currents which pass through the switching devices can be identified by the evaluation electronics to determine the switching conditions of the switching devices (S11–S14, S21–S24).

In order to identify the switching conditions of the switching devices (S11–S14, S21–S24) in each of the switching groups (1, 2), the inputs (e1, e2) of the switching groups is connected by a respective diode (D1, D2) disposed in the forward biased direction to respective first and second connections (A1, A2) of the evaluation electronics (AE). Each one of the outputs (a1, a2) of the switching groups (1, 2) is connected by a respective diode (D3, D4) disposed in the reverse biased direction to a respective other one of the first and second connections (A1, A2) of the evaluation electronics (AE). The switching groups (1, 2) are alternately connected to the evaluation electronics (AE) to the positive terminal and the negative terminal of the direct voltage power supply. The switching groups (1, 2) are connected by a respective measuring resistor (R1, R2) to the positive terminal of the direct voltage supply. The switching groups (1, 2) are connected by a respective PNP transistor (T1, T2) to the negative terminal of the direct voltage power supply.

Moreover, each of the first and second connections (A1, A2) of the evaluation electronics (AE) is connected by means of a respective resistor arrangement (R1', R1"; R2', R2") to a respective analog/digital converter input port (ADW1, ADW2) of a microcomputer ($\mu$C). Each of the first and second connections (A1, A2) of the evaluation electronics is also connected to the emitter of the respective PNP transistor (T1, T2). The collector of each PNP transistor (T1, T2) is connected to the negative terminal of the direct voltage supply. The base of each PNP transistor (T1, T2) is connected by a respective resistor arrangement (R1*, R1**; R2*, R2**) to a respective output port (Port1, Port2) of microcomputer ($\mu$C).

The aforementioned resistor arrangements—such as, for example, R1', R1"—consist of two resistors operating as a voltage divider. These resistor arrangements are only required if the direct voltage power supply has a relatively high voltage, for example, 12V. In the case of a lower voltage, for example, 5V, one resistor suffices between the connection lines of the inputs and outputs of the microcomputer ($\mu$C).

Preferably, it is desired to allocate a search indicator light (S) to the switching groups (1, 2). The search indicator light (S) is advantageously formed from two circuit branches. Each circuit branch includes a light source consisting of at least one light emitting diode. Preferably, two light emitting diodes (LD1'; LD1"; LD2', LD2") per circuit branch are connected by means of a respective drop resistor (RS1, RS2) to a third connection (A3) of the evaluation electronics (AE) and are connected to the outputs (a1, a2) of the two switching groups (1, 2).

In addition, the outputs (a1, a2) of the evaluation electronics (AE) are connected by a respective diode (D3, D4), connected in the reverse biased direction, to the second and first connections (A2, A1) appertaining to the input (a2, a1) of the other switching device group (2, 1). In order to actuate the search indicator light (S) the third connection (A3) is connected to the collector of a NPN transistor (T3'). The emitter of the NPN transistor (T3') is connected to the positive terminal of the direct voltage supply. The base of the NPN transistor (T3') is connected to the dividing point of a voltage divider (R3', R3"). The dividing point of the voltage divider (R3', R3") is connected to the positive terminal of the direct voltage supply and is connected to the emitter of a PNP transistor (T3"). The collector of the PNP transistor (T3") is connected to the negative terminal of the direct voltage power supply. The base of the PNP transistor (T3") is connected to the dividing point of the voltage divider (R3', R3") by a resistor arrangement (R3*, R3**) to a PWM output port of the microcomputer ($\mu$C) for receiving a pulse-width modulated signal.

If only a relatively low direct voltage supply—such as, for example, 5V, is required for the search indicator light then a PNP or NPN transistor in a suitable arrangement also fully suffices to exert an influence thereon by means of the PWM output.

In the case of a component (ASIC) tailored to specific customer requirements, the constructional elements appertaining to the evaluation electronics (AE), i.e., the transistors and resistors described above, are integrated into the microcomputer ($\mu$C).

The operation of the circuit arrangement described above will now be explained in more detail. When the electrical circuit arrangement is in a passive condition only the search indicator light (S) is in operation to aid a user of the circuit arrangement in selecting the individual switching devices. By actuating the base of the transistor (T3") the transistor (T3') is connected such that the positive terminal of the direct voltage supply is connected to the light emitting diodes (LD1, LD2). The light emitting diodes (LD1, LD2) are connected by the diodes D3 and/or D4 and by one and/or the other transistors (T1, T2) to the negative terminal of the direct voltage supply so that a brightness is imparted which is dependent upon the pulse-width modulated output signal of the microcomputer. The brightness of the search indicator light (S) can, however, also be influenced by the switched-on duration of the transistors (T1, T2), wherein the third connection (A3) in the evaluation electronics (AE) can then be switched directly to the positive terminal of the direct voltage power supply.

At certain time intervals, for example, every 10 milliseconds, the electrical circuit arrangement is activated, i.e., the switching device groups (1, 2) are interrogated cyclically one after another with respect to their switching condition. During this interrogation the search indicator light (S) is switched such that it is also connected to the negative terminal of the direct voltage power supply by the transistors (T1, T2). The respective collectors of the transistors (T1, T2) are connected to the negative terminal of the direct voltage power supply—and appertain to the non-actuated switching groups (1, 2).

In the case of one or a plurality of switched-on switching devices (S11–S14, S21–S24) of a switching group (1, 2), a voltage dependent in the allocated measuring resistor (R1, R2) drops and the associated analog/digital convertor port (ADW1, ADW2) obtains a corresponding signal which is recognized by the microcomputer ($\mu$C) and is used to actuate power drivers (not specifically shown) connected to electrical consumers (not specifically shown) associated with the switching devices. Because this process takes place in blocks in relatively short intervals it is ensured that switching conditions which change even for only a short time are detected.

Thus it is apparent that there has been provided, in accordance with the present invention, an electrical circuit arrangement that fully satisfies the objects, aims, and advantages set forth above. While the present invention has been described in conjunction with specific embodiments thereof, it is evident that many alternatives, modifications, and variations will be apparent to those skilled in the art in light of the foregoing description.

What is claimed is:

1. An electrical circuit arrangement for detecting the switching conditions of individual switching devices, the electrical circuit arrangement comprising:

a direct voltage source having a positive terminal and a negative terminal;

first and second switching groups each having a plurality of switching devices connected in parallel between a respective input (e1, e2) and a respective output (a1, a2), each one of the switching devices being switchable on and off;

a plurality of resistors each connected in series to a respective switching device between the respective inputs (e1, e2) and the respective outputs (a1, a2), wherein each one of the resistors has a selected resistance value for providing a voltage encoded signal output across the respective inputs (e1, e2) and the respective outputs (a1, a2) when the corresponding switching devices are switched on;

a first pair of diodes (D1, D2);

evaluation electronics having first and second connections (A1, A2), wherein the inputs (e1, e2) of each one of the first and second switching groups is connected by a respective one of the first pair of diodes (D1, D2) to a respective one of the first and second connections (A1, A2) of the evaluation electronics, wherein the first pair of diodes (D1, D2) are forward biased from the first and second connections (A1, A2) of the evaluation electronics to the inputs (e1, e2) of the first and second switching groups; and a second pair of diodes (D3, D4), wherein the outputs (a1, a2) of each one of the first and second switching groups is connected by a respective one of the second pair of diodes (D3, D4) to a respective other one of the first and second connections (A1, A2) of the evaluation electronics, wherein the second pair of diodes (D3, D4) are reversed biased from the first and second connections (A1, A2) of the evaluation electronics to the outputs (a1, a2) of the first and second switching groups;

wherein the evaluation electronics alternately connect at predetermined time intervals the inputs (e1, e2) and outputs (a1, a2) of each of the first and second switching groups to the positive terminal and negative terminal of the direct voltage source to measure the voltage encoded signal for determining which switching devices are switched on.

2. The electrical circuit arrangement of claim 1 wherein:

the evaluation electronics further includes a microcomputer ($\mu$C) having two control output ports, wherein each one of the control output ports is connected to the base of a respective switching transistor by a respective first resistor arrangement (R1*, R1**; R2*, R2**).

3. The electrical circuit arrangement of claim 2 wherein:

the emitter of each one of the respective transistors is connected by a measuring resistor to the positive terminal of the direct voltage source.

4. The electrical circuit arrangement of claim 3 wherein:

the evaluation electronics further includes two analog/digital converter inputs, wherein each one of the converter inputs is connected to the emitter of a respective one of the switching transistors by a respective second resistor arrangement (R1', R1"; R2', R2").

5. The electrical circuit arrangement of claim 1 further comprising:

a pair of search indicator lights associated with a respective one of the first and second switching groups, wherein each of the search indicator lights includes a light emitting diode connected between a third connection (A3) of the evaluation electronics to one of the first and second connections (A1, A2) of the evaluation electronics across a respective one of the second pair of diodes (D3, D4).

6. The electrical circuit arrangement of claim 5 wherein:

the evaluation electronics supplies a pulse-width modulated signal to the pair of search indicator lights.

7. The electrical circuit arrangement of claim 6 wherein:

the third connection (A3) of the evaluation electronics is connected to the positive terminal of the direct voltage supply by a PNP transistor.

8. The electrical circuit arrangement of claim 7 wherein:

the base of the PNP transistor is connected by a voltage divider to the positive terminal of the direct voltage source and to the emitter of a NPN transistor.

9. The electrical circuit arrangement of claim 8 wherein:

the base of the NPN transistor is connected to an pulse-width modulated output port of the microcomputer for receiving the pulse-width modulated signal.

10. The electrical circuit arrangement of claim 5 wherein:

the brightness of the pair of search indicator lights is dependent upon the switched-on duration of the switching transistors.

11. The electrical circuit arrangement of claim 1 wherein:

the negative terminal of the direct voltage source is connected to electrical common.

* * * * *